United States Patent

Livezey et al.

[15] 3,686,541

[45] Aug. 22, 1972

[54] FLEXIBLE RESILIENT MEMBER FOR APPLYING A CLAMPING FORCE TO THYRISTOR UNITS

[72] Inventors: John P. Livezey, Broomall; Daniel B. Rosser, Springfield, both of Pa.

[73] Assignee: General Electric Company

[22] Filed: July 19, 1971

[21] Appl. No.: 163,660

[52] U.S. Cl..........317/234 R, 317/234 A, 317/234 B, 317/234 N, 317/234 P, 165/80, 29/589

[51] Int. Cl...............................H01l 3/00, H01l 5/00

[58] Field of Search..........317/234, 1, 1.5, 5.4, 6, 11; 29/581, 589, 590, 591; 165/80; 313/278

[56] References Cited

UNITED STATES PATENTS

| | | | |
|---|---|---|---|
| 2,751,528 | 6/1956 | Burton | 317/234 |
| 3,377,206 | 4/1968 | Hanlein et al. | 317/234 |
| 3,474,306 | 10/1969 | Vogt | 317/234 |

FOREIGN PATENTS OR APPLICATIONS

| | | | |
|---|---|---|---|
| 1,011,171 | 11/1965 | Great Britain | 317/234 |
| 1,914,398 | 10/1969 | Germany | 317/234 |

*Primary Examiner*—James D. Kallam
*Assistant Examiner*—Andrew J. James
*Attorney*—J. Wesley Haubner et al.

[57] ABSTRACT

Disclosed is a cooled assembly for mounting and applying clamping pressure to a plurality of semiconductor rectifiers and for electrically connecting them in parallel. The pressure is applied via a pair of heat dissipating electrodes disposed on opposite sides of the rectifiers. Each electrode contains a plurality of heat dissipating fins. Clamping means including a tie bolt with leaf springs thereon apply the clamping forces through the heat dissipating electrodes to the rectifiers. Means are provided which coact with slots in the leaf springs for directing and maintaining the clamping force on the axes of the clamped rectifiers.

5 Claims, 4 Drawing Figures

Patented Aug. 22, 1972 3,686,541

2 Sheets-Sheet 1

INVENTORS:
DANIEL B. ROSSER,
JOHN P. LIVEZEY,

BY Barry A. Stein
ATTORNEY

INVENTORS:
DANIEL B. ROSSER,
JOHN P. LIVEZEY,
BY Barry A. Stein
ATTORNEY

FLEXIBLE RESILIENT MEMBER FOR APPLYING A CLAMPING FORCE TO THYRISTOR UNITS

BACKGROUND AND OBJECTS OF THE INVENTION

This invention relates to semiconductor rectifier mounting assemblies and more particularly it relates to means for applying axial pressure to assembly mounted semiconductor rectifiers.

In copending patent application, Serial No. 88,056, filed on Nov. 9, 1970 and application Ser. No. 111,257 filed Feb. 1, 1971 which are assigned to the same assignee of this invention there are disclosed novel heat dissipating assemblies for mounting broad area high current semiconductor rectifiers under pressure.

Such rectifiers are commonly constructed with a broad area semiconductor wafer, having at least one PN rectifying junction, hermetically sealed in a housing including an insulating sleeve and a pair of conductive terminals which contact opposite sides of the rectifier and cap the respective ends of the sleeve. Intimate contact can be maintained between the wafer and the terminal members of such rectifiers by the application of high pressure to the latter without utilizing solder or other bonding means.

In operation the passage of current through the rectifying junctions results in the generation of heat therein. Any contact resistance between the wafer and the terminals is another source of heat. Since the current handling ability of a semiconductor rectifier is temperature limited, it is important to minimize the contact resistance while efficiently extracting the heat that is generated. Toward that end the rectifier is sandwiched between opposing heat sinks which are clamped together by external spring means to apply high pressure evenly over the entire area of the interposed wafer to achieve and maintain low electrical and thermal contact resistance and to contact heat away from the rectifier. For higher current ratings, an array of similarly poled rectifiers can be mounted in parallel between a single pair of heat sinks. Here it is particularly important to efficiently extract and radiate the rectifier generated heat.

As disclosed in the above mentioned applications each of the heat sinks are disposed on opposite sides of a parallel array of semiconductor rectifiers and each comprises a heat dissipating electrode having a plurality of cooling fluid ducts therein. The cooling fluid ducts are formed by a plurality of heat dissipating fins connected between a pair of members, with the fins serving to transmit thrust from the external spring means to one of said members which has a planar surface parallel to the adjacent terminals of the rectifiers. The ducts in the electrode are relatively narrow and are disposed immediately adjacent to the sandwiched rectifier so that high velocity, turbulent air passing therethrough is effective for cooling the rectifiers.

Clamping pressure for the rectifiers is applied to each rectifier through the heat dissipating electrodes. The means for effectuating the clamping pressure comprises a separate tie bolt-leaf spring configuration for each pair of a plurality of pairs of rectifiers. Each of the tie bolt-leaf spring configurations includes an elongated tie bolt and a pair of leaf springs each of which is connected to a respective end of the tie bolt. At least two heat dissipating electrodes and the semiconductor rectifiers interposed therebetween are sandwiched between the pair of tie bolts. When arranged in this manner, upon the tightening of the tie bolts the leaf springs are flexed thereby imparting a compressive force of the heat dissipating electrodes. This compressive force is transmitted through the electrodes heat dissipating fins to the interposed semiconductor rectifiers.

In order for a semiconductor rectifier to operate efficiently it must be clamped in such a manner that the clamping force is directed along its axes. If the clamping force is directed in anything but an axial manner the pair of conductive terminals which contact opposite sides of the semiconductor wafer will not apply equal pressure across the entire wafer face. This will result in unequal current and heat distribution throughout the semiconductor wafer thereby increasing the possibility of the creation of potentially destructive "hot spots."

Accordingly it is an object of our invention to provide means in a semiconductor rectifier mounting assembly for insuring that the clamping force is applied to the rectifiers in an axial direction.

It may be desirable under certain circumstances to either lessen or increase the pressure on the clamped rectifiers by either loosening or tightening of the tie bolts. In making such an adjustment it is expeditious to have means which automatically direct the clamping force in an axial direction on the clamped rectifiers irrespective of the degree to which the tie bolts are tightened or loosened.

Therefore, it is a further object of our invention to provide means in a semiconductor rectifier mounting assembly for automatically directing an axial clamping force on the mounted rectifiers irrespective of changes in the amount of clamping pressure.

SUMMARY OF THE INVENTION

In carrying out our invention in one form, means are provided for applying and maintaining axial clamping pressure on plural rectifier devices mounted with their axes parallel to one another in a pressure mounting assembly. The clamping pressure is applied via a pair of opposed heat dissipating electrodes, each comprising a pair of members one of which having a contact surface thereon. A plurality of force-transmitting-heat-dissipating fins is connected between the members. The rectifiers are disposed between the opposed heat dissipating electrodes with their anode terminals in intimate heat engagement with a contact surface of one electrode and with their cathode terminals in intimate heat engagement with a contact surface of the other electrode. Clamping means are provided for applying a force to the heat dissipating electrodes so that the force can be transmitted therethrough to the rectifier terminals. The clamping means comprise a two ended tension member associated with each pair of rectifiers mounted in the assembly. Each tension member is located between and parallel to the axes of its associated pair of rectifiers and extends through both of said heat dissipating electrodes. Disposed at each end of each tension member is a spring.

In accordance with our invention the spring is provided with slots therein. The slots communicate with pressure spreading members which are disposed at selected points on the heat dissipating electrodes. Each of the selected points lies on axis of a rectifier. The slots and pressure spreading members coact in such a manner that irrespective of the amount to which the springs are flexed the force applied thereby is always directed along the axis of the rectifiers.

BRIEF DESCRIPTION OF THE DRAWINGS

Our invention will be better understood and its various objects and advantages will be more fully appreciated from the following description taken in conjunction with the accompanying drawings in which.

DETAILED DESCRIPTION OF THE PREFERRED EMBODIMENTS

Some of the features shown and described herein form the subject of the previously noted copending patent applications.

Figure 1:
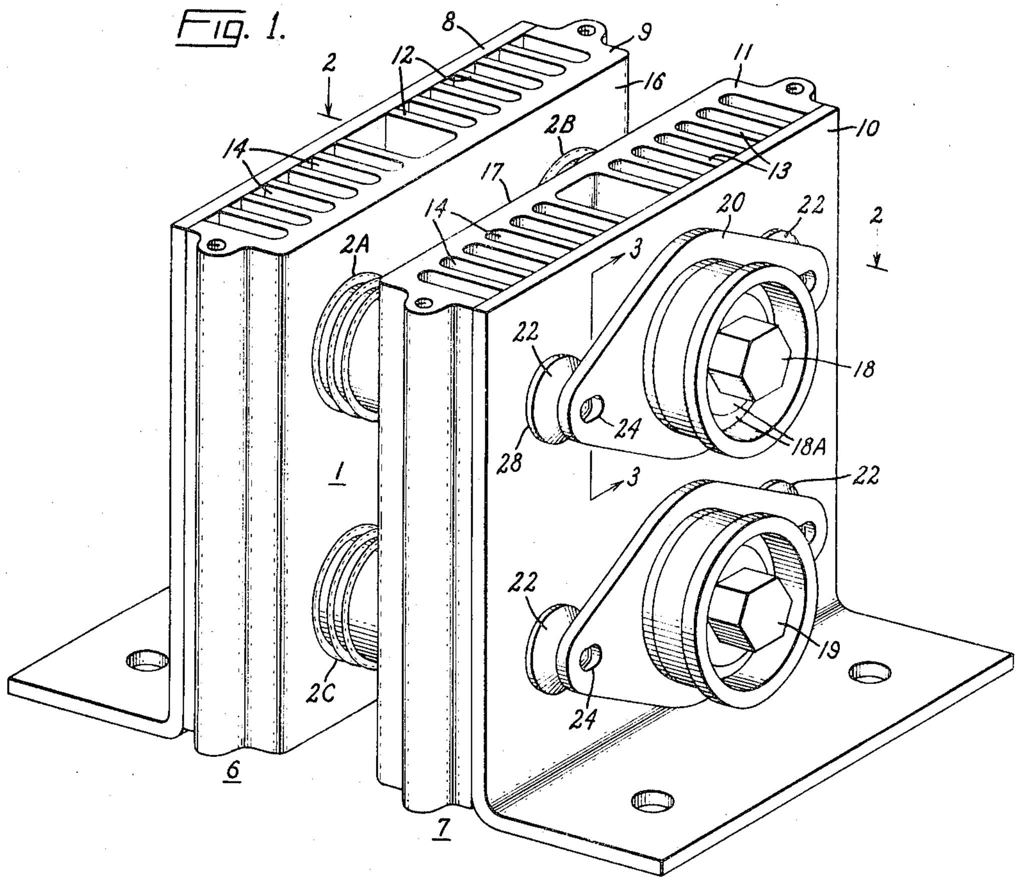
FIG. 1 is a perspective view of a semiconductor rectifier pressure assembly utilizing our invention.

Insofar as our invention is concerned, FIG. 1 shows a pressure assembly holding for high current semiconductor rectifier devices each of which may be of a style shown on pages 349 to 351 of the General Electric SCR Manual, 4th Edition (1967). The individual rectifier devices are electrically and mechanically connected in parallel in the assembly to provide a very high current handling capability. Further, the rectifiers mounted in one pressure assembly may be electrically connected in series with those in other similar assemblies to form a high voltage valve suitable for connection with other such valves to form a bridge circuit for a High Voltage Direct Current (HVDC) power system.

In order to maintain operating integrity of the rectifier devices in such a system, cooling means are preferably provided to extract the heat generated by the devices during their operation. In a copending patent application Ser. No. 99,895 filed on Dec. 12, 1970, assigned to the same assignee as our invention, there is disclosed an air cooling system for an HVDC valve in which cooling air is driven through a housing containing a plurality of rectifier holding pressure assemblies such as those herein disclosed. That system is arranged so that equal amounts of cooling air pass through the passages in the assembly as a result of a high pressure drop therethrough to efficiently extract the heat generated by the rectifier devices contained therein.

In order to cool the individual rectifiers most efficiently, it is preferable to utilize the passage of high velocity, turbulent air through the cooling ducts which are arranged in intimate relationship with those rectifiers. Accordingly, the assembly is designed so that narrow, turbulence-creating cooling ducts are in close proximity with the rectifier devices to provide effective large area cooling surfaces immediately adjacent thereto.

Figure 2:
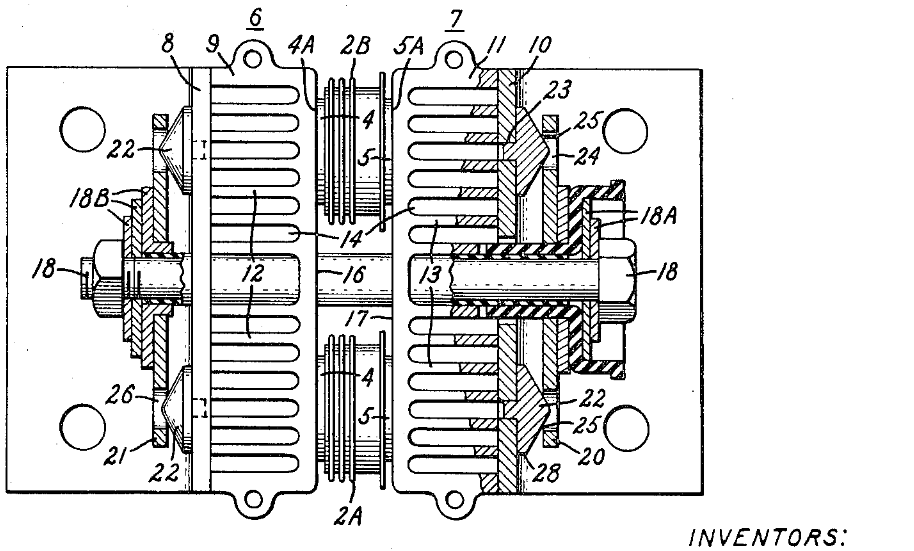
FIG. 2 is a partial cross sectional view along line 2—2 of FIG. 1.
Figure 3:
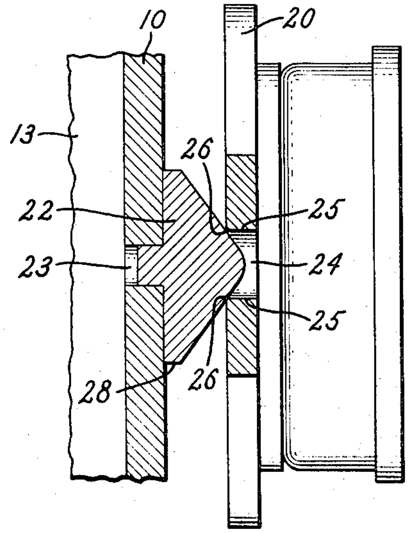
FIG. 3 is a partial cross sectional view taken along line 3—3 of FIG. 1.

As shown in FIGS. 1–3 pressure assembly 1 houses four high current semiconductor rectifier devices, namely, 2A, 2B, 2C, and 2D. These devices are arranged in pairs with 2A and 2B forming one pair and 2C and 2D forming a second pair. All of the devices are oriented so that their axes are parallel to one another. Each device comprises a broad area disk-like semiconductor wafer (not shown) having at least one PN rectifying junction. The wafer is disposed in a ceramic sleeve and sandwiched between a pair of terminals 4 and 5. Each terminal has a relatively flat external contact surface which is perpendicular to the axes of the device. Terminal 4 and its associated contact surface 4A form the anode of the rectifier while terminal 5 and its associated contact surface 5A form the cathode.

The devices shown in FIGS. 1–3 may either be diodes or thyristors (i.e., controlled rectifiers) depending upon the function to be performed. If the devices are thyristors the wafers are characterized by four layers of silicon of alternately PN type conductivity, one of which has a gate contact which is connected to an external gate lead (not shown).

Each device is disposed mechanically between and connected electrically in series with a pair of opposed heat dissipating electrodes 6 and 7 which serve as combined electrical and thermal conductors. Towards this end these electrodes are made of a conductive metal such as aluminum. Electrode 6 includes a pair of planar members 8 and 9. Sandwiched between these members are a plurality of forced transmitting heat dissipating fins 12 which may be integral with members 9, or may be integral with both members 8 and 9 if desired. Similarly, electrode 7 includes a pair of planar members 10 and 11 in a plurality of forced transmitting heat dissipating fins 13 therebetween which may be integral with members 10 and 11 if desired. Preferably member 9 and its associated fins 12 are formed from an integral aluminum extrusion, as is member 11 and its associated fins 13. The fins are relatively stubby (e.g., ⅛ inch thick and 1 ¼ inch high) and are disposed close to one another (e.g., one-fourth inch apart) to form a plurality of narrow cooling fluid ducts or passages 14 which extend for a short distance (e.g., 7 inches) in a direction perpendicular to the axes of the rectifiers. It is through these passages that a cooling fluid, such as air is passed in order to extract the heat which is generated by the rectifiers mounted in the assembly.

The anode, cathode and semiconductor wafer of each rectifier are conductively coupled by pressing their contiguous surfaces together under high pressure. This is accomplished by sandwiching the device under pressure between electrodes 6 and 7. Toward that end planar member 9 includes a relatively planar or flat side 16 which is generally parallel to the contact surface of all of the rectifiers and is adapted to abut in intimate heat engagement the anode contact surfaces of all of the rectifiers. Planar member 11 includes a relatively planar or flat side 17 similarly oriented and adapted to abut in intimate heat engagement their cathode contact surface. No solder or other means is used for bonding the rectifier parts and the contact electrodes together and the contact electrodes are completely separable from the rectifiers. Nevertheless, good electrical and thermal conductivity at the junctions of these parts is obtained in our assembly by subjecting the contact electrodes to a high force (e.g., 8,000 pounds) distributed evenly over the devices.

In order to ensure that even distribution of pressure exists over substantially the whole wafer area of each of the parallel connected rectifiers, means are provided for directing the clamping force axially on each rectifier. Such means are provided for each pair of rectifiers mounted in the assembly. As can be seen in FIG. 2 a central tension member or tie bolt 18 is provided to extend between the pair of rectifiers 2A and 2B parallel to and in the plane of their axes. A similarly constructed and disposed tie bolt 19 is provided between the pair of rectifiers 2C and 2D. Coupled to the respective ends of tie bolt 18, via respective washers 18A and 18B, are flexible resilient members or leaf springs 20 and 21. Similar leaf springs are coupled to the ends of tie bolt 19 in a similar manner. The function of the flexible leaf springs is to transmit a compressive force, which is generated by tightening the tie bolts, to the heat dissipating electrodes which in turn transmit it to the rectifier sandwiched therebetween.

In order to ensure that the compressive force is applied axially on the rectifiers tapered pressure spreading members 22 are disposed coaxially therewith. As shown the pressure spreading members are preferably conical members. These members are held in position in restraining holes 23 of planar members 8 and 10. The conical members are adapted to sit in and to coact with elongate openings or slots 24 which are provided in each leaf spring. As can be seen from FIGS. 1, 2 and 3 the slots in each spring are oriented so that their major axis lies along the line connecting them. Each slot includes a pair of major walls 25 oriented in a direction parallel to the major axis of the slot. The width of the slot (i.e., the distance between the major walls 25) is such that there are always points on the periphery of the coacting conical members in contact with the major walls. This arrangement can be seen clearly in FIG. 3 which is a partial cross sectional view along line 3—3 of FIG. 1.

As shown therein major walls 25 contact points 26 on conical member 22. The major walls act as tracks or guides to enable movement of the slot along its major axis relative to the conical member seated therein. The conical member remains in position centered on the axis of the rectifier by the action of restraining hole 23.

Figure 4:
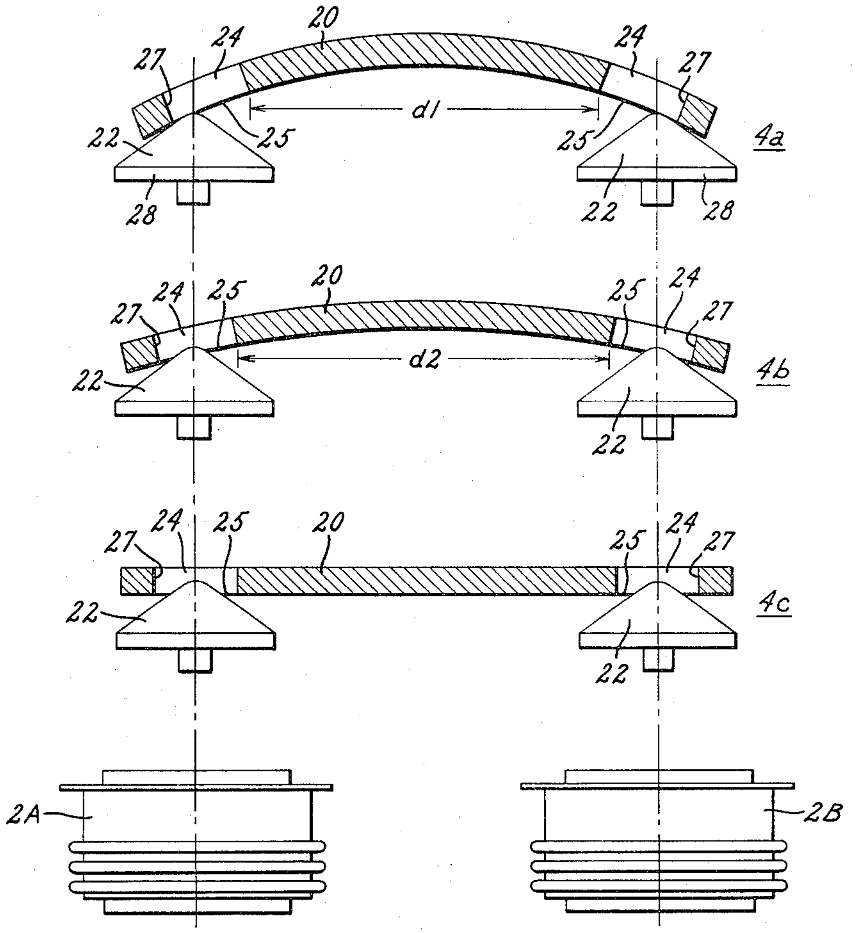
FIG. 4 is a schematic diagram of the operation of our invention.

The position of the slots with respect to the coacting conical members for various degrees of spring flexure is shown in FIG. 4. For example, FIG. 4A shows in schematic form spring 20 in a relatively unstressed condition. In such a condition the spring is bowed and each of the conical members are in contact with an end wall 27 of the slot 24 as well as in contact with the major walls 25. The distance between the slots measured along the line parallel to the plane of the rectifiers conductive terminals is denoted as *d*1. The axis of one conical member 22 is coaxial with the axis of rectifier 2A and the axis of the other conical member 22 is coaxial with the axis of rectifier 2B.

Upon tightening of tie bolt 18 the spring is flexed to a moderately flexed position shown in FIG. 4*b*. As should be appreciated due to the flexure of the spring the distance between the slots measured along the above noted line will have increased. The increased distance is denoted as *d*2. If the pressure spreading members were configurated to fit in a mating relationship with the openings, the flexure of the springs and the concommitant spreading apart of the openings relative to one another would result in the imposition of forces on the conical members in a skewed outward, as opposed to axial, direction. However, since the openings or slots are elongate they are able to freely move in a direction parallel to their major axis and are guided in so doing by the action of their respective major walls sliding across the respective stationary conical members. This action enables the force transmitted by the spring's flexure to be directed in an axial direction on the rectifiers. Upon further tightening of the tension member or tie bolt 18, the spring is flexed to the position shown in FIG. 4C. Even with such a severe degree of flexure the force impressed on the conical members is axial due to the relative movement between the slots and those members. Accordingly, it should be appreciated that upon tightening of a tie bolt, the compressive force from the springs thereon will be applied to portions of the heat dissipating electrodes centered over the axis of the sandwiched rectifiers, notwithstanding the fact that the slots would have moved relative to the conical members seated therein as a result of the spring's flexure as the bolts are tightened.

Conical members 22 are provided with relatively large bases 28 so that the compressive force from the leaf spring is spread out over a portion of the planar members 8 and 10. This ensures that the applied force although centered coaxially on the rectifiers, is nevertheless transferred to those rectifiers via a plurality of stubby heat dissipating fins and the planar members. In so doing the clamping force will be equalized across the anode and cathode contact surfaces on the clamped rectifiers.

While we have shown and described a particular embodiment of our invention, it will be obvious to those skilled in the art that various changes and modifications may be made without departing from our invention in its broader aspects; and we, therefore, intend herein to cover all such changes and modifications as fall within the true spirit and scope of our invention.

What we claim as new and desire to secure by Letters Patent of the United States is:

1. In a semiconductor rectifier assembly:

a. at least one semiconductor rectifier device including a semiconductor body in a sealed housing between a pair of main electrodes having external first and second contact surfaces on opposite sides of the housing;

b. means for mounting said device with its main electrodes held under high clamping pressure, said mounting means including one heat dissipating electrode abutting a contact surface of said rectifier device;

c. force applying means for applying an axial clamping force through said heat dissipating electrode to said rectifier device, said force applying means including:

i. a tension member; and ii. a flexible resilient member connected to said tension member, said resilient member including an opening having a major axis; and d. a tapered member movably seated in said opening and stationarily connected to said heat dissipating electrode at a point lying on the axis of said rectifier device, the major axis of said opening being oriented in a direction that enables said opening to move along its major axis with respect to the stationary tapered member upon flexure of said resilient means.

2. The semiconductor rectifier assembly as specified in claim 1 wherein said resilient means comprises a leaf spring.

3. A semiconductor rectifier assembly as specified in claim 2 wherein said opening is an elongated slot having two major walls oriented in a direction parallel to its major axis and wherein said walls contact points on the periphery of said tapered member.

4. In a semiconductor rectifier assembly as specified in claim 1 wherein said tapered member is of generally conical shape.

5. A semiconductor rectifier assembly as specified in claim 1 wherein said tapered member has a relatively large base, said base abutting said heat dissipating electrode.

* * * * *